United States Patent
Nakao

[11] Patent Number: 6,162,736
[45] Date of Patent: Dec. 19, 2000

[54] PROCESS FOR FABRICATING A SEMICONDUCTOR INTEGRATED CIRCUIT UTILIZING AN EXPOSURE METHOD

[75] Inventor: Shuji Nakao, Tokyo, Japan

[73] Assignee: Mitsubishi Denki Kabushiki Kaisha, Tokyo, Japan

[21] Appl. No.: 08/799,595

[22] Filed: Feb. 12, 1997

[30] Foreign Application Priority Data

Sep. 11, 1996 [JP] Japan .................................. 8-240096

[51] Int. Cl.⁷ .................................................. H01L 21/302
[52] U.S. Cl. .......................... 438/736; 438/717; 438/735; 438/738; 438/782
[58] Field of Search .............................. 257/435; 438/975, 438/735, 736, 950, 738, 717, 782; 430/5, 318, 313, 312, 323; 355/53, 77

[56] References Cited

U.S. PATENT DOCUMENTS

| | | | |
|---|---|---|---|
| 5,329,335 | 7/1994 | Wada et al. | 355/53 |
| 5,455,144 | 10/1995 | Okamoto et al. | 430/313 |
| 5,605,775 | 2/1997 | Watanabe | 430/5 |
| 5,608,576 | 3/1997 | Han et al. | 359/562 |
| 5,627,626 | 5/1997 | Inoue et al. | 355/67 |
| 5,667,941 | 9/1997 | Okamoto et al. | 430/313 |
| 5,808,796 | 9/1998 | Kang et al. | 359/562 |
| 5,882,827 | 3/1999 | Nakao | 430/5 |
| 6,043,164 | 3/2000 | Nguyen et al. | 438/736 |

FOREIGN PATENT DOCUMENTS

| | | |
|---|---|---|
| 41 15 909 | 11/1992 | Germany . |
| 58-209124 | 12/1983 | Japan . |
| 4-158522 | 6/1992 | Japan . |
| 4-273427 | 9/1992 | Japan . |
| 5-243114 | 9/1993 | Japan . |
| 6-151269 | 5/1994 | Japan . |

OTHER PUBLICATIONS

Hisashi Watanabe "2×2 Phase Mask For Arbitrary Pattern Formation" Jpn. J. Appl. Phys. vol. 33 (1994) pp. 6790–6795 Part 1, No. 12B, Dec. 1994.

Primary Examiner—Donald L. Monin, Jr.
Assistant Examiner—Alonzo Chambliss
Attorney, Agent, or Firm—Oblon, Spivak, McClelland, Maier & Neustadt, P.C.

[57] ABSTRACT

In a method of manufacturing a semiconductor device, a plurality of inter layer conductive path is formed through a first resist pattern which in turn is formed by an exposure of a hole pattern mask. A plurality of conductive lines is formed, adjacent to the layer of the conductive paths, through a second resist pattern which in turn is formed by double exposure of a line pattern mask and the hole pattern mask. Each conductive line is positioned on at least one of the conductive paths. Or alternatively, each conductive path is positioned between the lines.

2 Claims, 3 Drawing Sheets

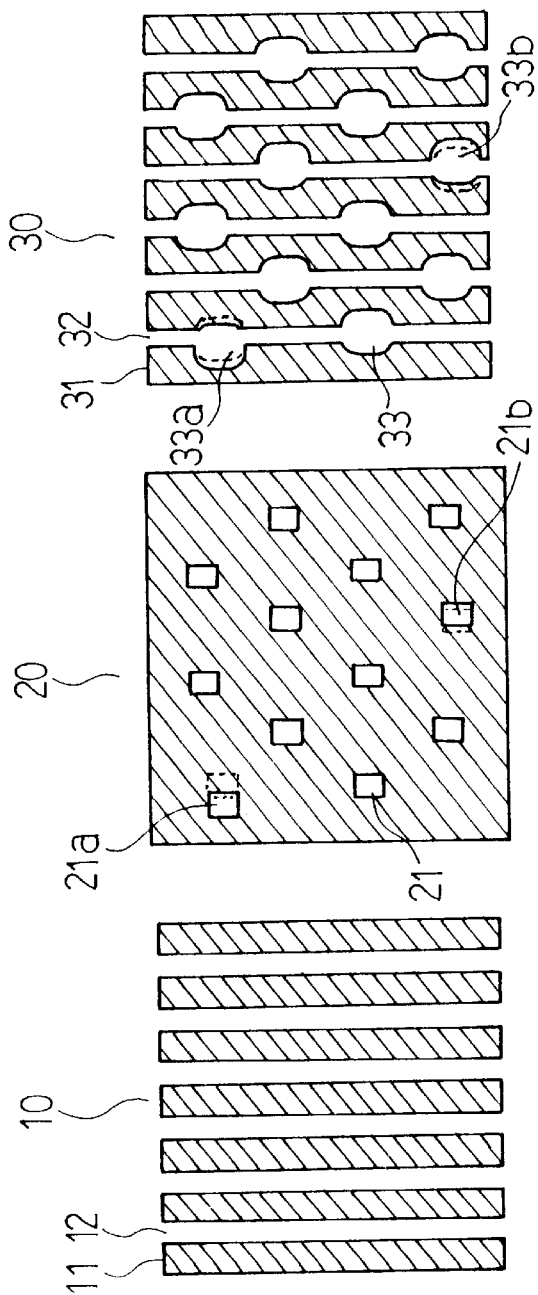
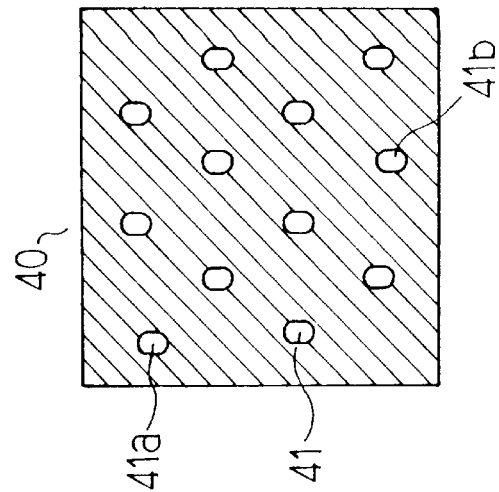
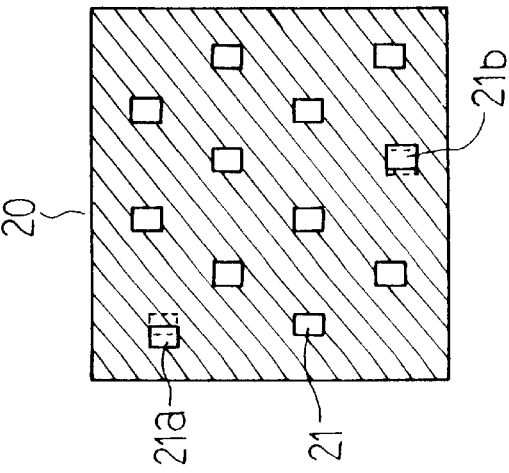
Fig.1(A)
Fig.1(B)

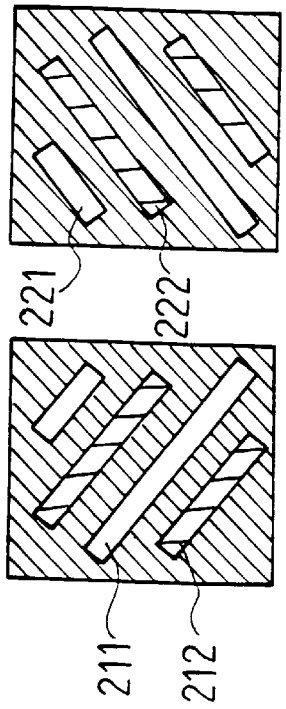
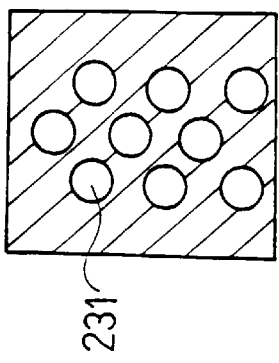
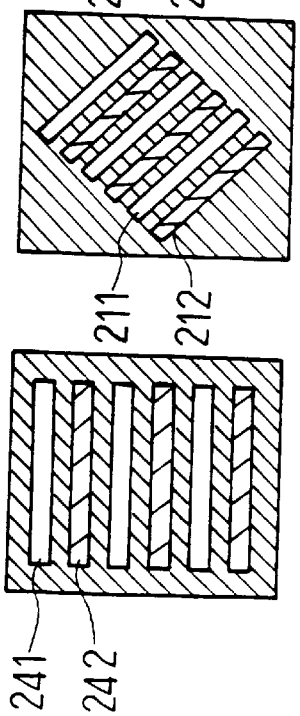
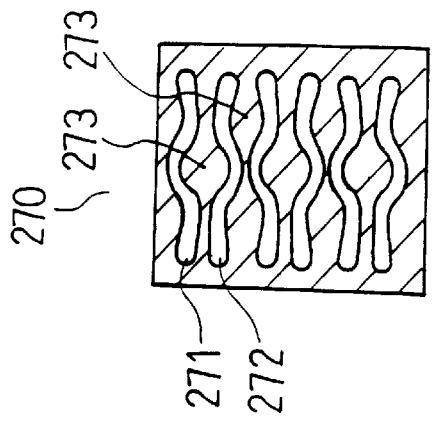
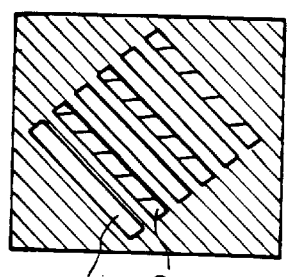
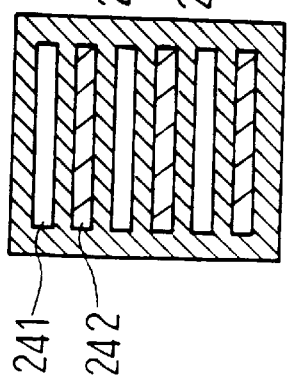
Fig.3(A)
Fig.3(B)

PROCESS FOR FABRICATING A SEMICONDUCTOR INTEGRATED CIRCUIT UTILIZING AN EXPOSURE METHOD

BACKGROUND OF THE INVENTION

1. Field of the Invention

The present invention relates to an exposure method in photolithography for forming a fine pattern in a semiconductor device such as a semiconductor integrated circuit, and further to a semiconductor device and a manufacturing method thereof using the exposure method.

2. Description of the Prior Art

To form a pattern of a semiconductor integrated circuit, improvement of the overlap accuracy between mask layers is important. The mask-layer overlap accuracy is determined by many factors, including a mark detection accuracy in the stepper, the distortion of the wafer due to process treatment, and the field distortion of the stepper. Distortion of the photomask serving as the original plate is one of the most important of the above factors. The existing photomask manufacturing method has a mask-pattern position accuracy of approx. ±0.07 mm. Therefore, in this case, patterns of two masks which should originally be located at the same position may be formed with a separation of approx. 0.03 mm from each other on a wafer projected with a reduction factor up to ⅕. The net overlap accuracy of mask patterns has been approx. ±0.06 mm so far, which is equivalent to 0.12 mm in range. Therefore, the position uncertainty of the mask consumes approx. ¼ the range.

This problem has been improved so far by improving mask manufacturing accuracy. However, because the position control technique in the mask manufacturing is already very precise, further improvement is expected to be difficult. The present invention is designed to improve the overlap accuracy between plural mask layers in forming a pattern of a semiconductor integrated circuit as stated above.

SUMMARY OF THE INVENTION

The purpose of the present invention is to provide an improved projection exposure method for automatically negating the influence of a mask error on overlap accuracy in the mask manufacturing method, and further to provide a semiconductor device and manufacturing method thereof using the above exposure method.

According to one aspect of the present invention, in a method of manufacturing a semiconductor device on a semiconductor substrate, a first layer (for instance, a interlayer conducting paths layer) is formed through a first resist pattern which in turn is formed by an exposure of a first mask (for instance, a hole pattern mask). Also, a second layer (for instance, a parallel lead layer) is formed adjacent to the first layer through a second resist pattern which in turn is formed by double exposure of a second mask (for instance, a parallel lead mask) and the first mask.

In another aspect of the present invention, in the method of manufacturing a semiconductor device, the first mask is for forming a pattern of a plurality of holes perpendicular to the principal plane of the semiconductor substrate, and the second mask is for forming a pattern of a plurality of lines parallel to the principal plane of the semiconductor substrate.

In another aspect of the present invention, in the method of manufacturing a semiconductor device, the first layer is composed of a plurality of inter layer conductive paths perpendicular to the principal plane of the semiconductor substrate, and the second layer is composed of a plurality of conductive lines parallel to the principal plane of the semiconductor substrate.

In another aspect of the present invention, in the method of manufacturing a semiconductor device, a plurality of inter layer conductive paths perpendicular to the principal plane of the semiconductor substrate are first formed by a first mask, and then a plurality of conductive lines parallel to the principal plane of the semiconductor substrate are formed by a second mask and the first mask, and further each line is positioned on at least one of the conductive paths.

In another aspect of the present invention, in the method of manufacturing a semiconductor device, a plurality of conductive lines parallel to the principal plane of the semiconductor substrate are formed first by the second mask and the first mask, and then a plurality of inter layer conductive path perpendicular to a principal plane of the semiconductor substrate are formed by the second mask, and further each conductive path is positioned between the lines.

In another aspect of the present invention, in the method of manufacturing a semiconductor device, the first mask includes al least two Levenson phase shift mask, and the second mask includes at least one Levenson phase shift mask.

BRIEF DESCRIPTION OF THE DRAWINGS

A more complete appreciation of the invention and many of the attendant advantages thereof will be readily understood by reference to the following detailed description when considered in connection with the accompanying drawings, wherein:

FIGS. 1(A) and 1(B) are conceptual drawings showing a lead-layer exposure method of the embodiment 1;

FIGS. 3(A) and 3(B) are conceptual drawings showing the lead-layer exposure method of the embodiment 3.

DETAILED DESCRIPTION OF THE PREFERRED EMBODIMENTS

Figures 2A, 2B:
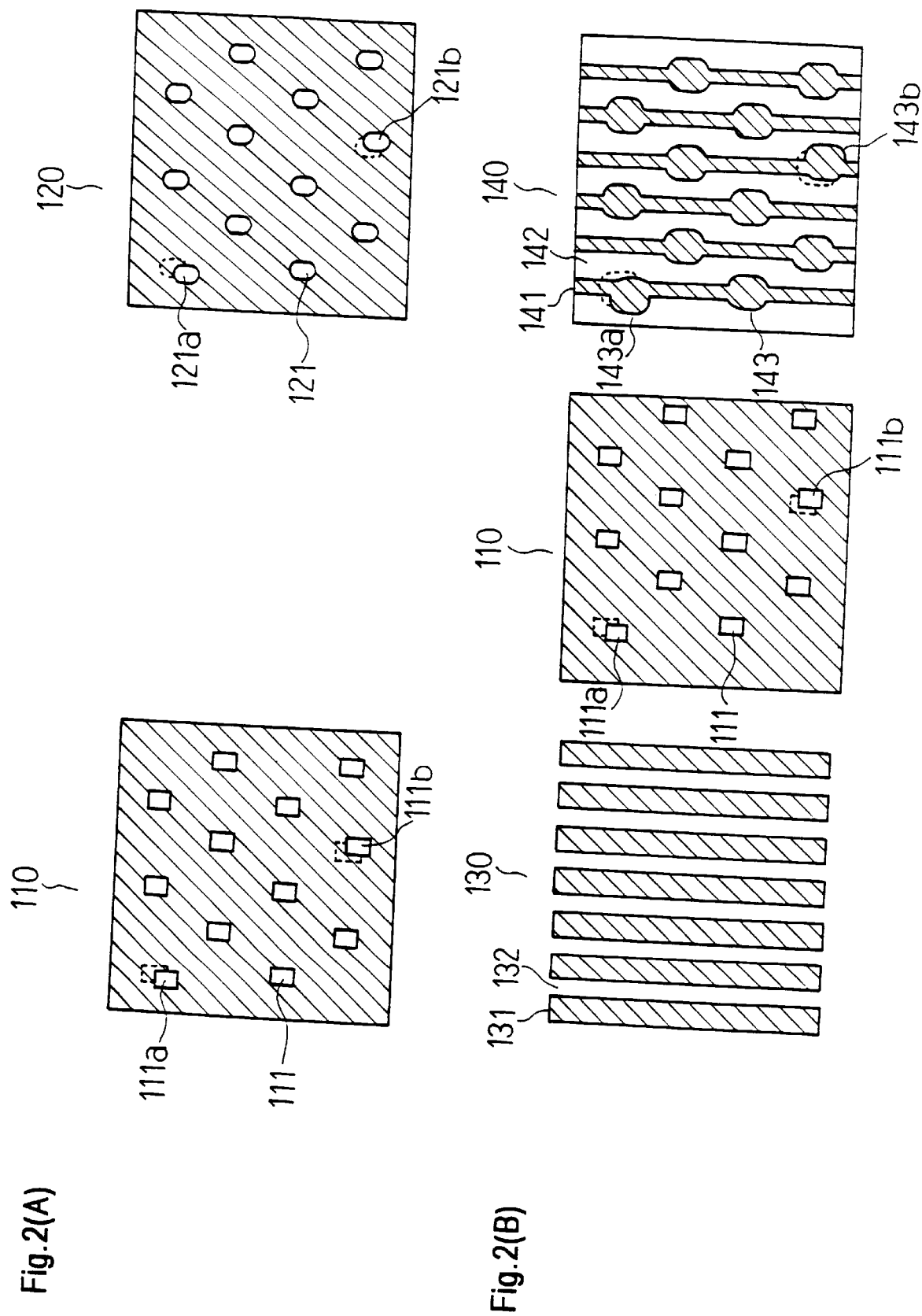
FIG. 2(A) and 2(B) are conceptual drawing showing a method for exposing a lead-layer of the embodiment 2.

The present invention will become apparent from the following detailed description of the preferred embodiments with reference to the accompanying drawings showing the embodiments. Throughout the drawings, identical or corresponding elements are denoted by the same reference numerals.

Embodiment 1

The first embodiment of the present invention is described below by referring to the accompanying drawings. FIGS. 1(A) and 1(B) are conceptual drawings showing a lead-layer exposure method of the first embodiment. The pattern of the lead layer of the first embodiment is formed so that a hole formed on the upper layer penetrates the lead layer without contacting the lead.

First, formation of the lead layer is described below.

In FIG. 1(A), a first-time exposure mask 10 includes a pattern 11 of parallel lead lines made of chromium (Cr), and a pattern 12 of spaces between the lead lines. The exposure uses a chromium (Cr) mask or the like.

A positive resist film previously formed to form a lead-layer pattern is first exposed by the mask 10 having parallel lead patterns, which serves as a first-time mask. The positive resist film is exposed at an exposure level at which the width of the space pattern 12, where a hole does not penetrate, attains a predetermined width.

Then, in FIG. 1(A), a second-time exposure mask 20 includes a pattern 21 of holes, and is used for forming holes between the lead lines formed by the lead pattern mask 10. The mask 20 for the hole pattern contains holes 21a and 21b, which are unintentionally deviated from their designed positions shown by the broken lines respectively. For the second-time exposure mask 20, a chromium (Cr) mask or a half tone mask is used.

Subsequent to the exposure by the first-time exposure mask 10, the second-time exposure mask 20, which is a mask for forming a hole in the subsequent hole step, is used for exposing a positive resist film as a second-time exposure mask. The exposure is performed at an exposure level at which the area between lead lines through which a hole penetrates attains a necessary dimension. Thus, in the case of the first embodiment, the positive resist film is double-exposed by the lead layer mask 10 and the hole layer mask 20.

Then, as shown in FIG. 1(A), a positive resist pattern 30 for forming a lead-layer is obtained by combining the first-time and second-time exposures. The positive resist pattern 30 includes lead patterns 31, space pattern or inter-lead pattern 32, and an expanded portion 33 of a space through which a hole penetrates. Expanded space portions 33a and 33b are formed at positions deviated from designed positions, which is shown by dotted lines. Thus, through double exposures by the first-time exposure mask 10 and the second-time exposure mask 20, the position of an expanded area between lead lines is determined not by the design but by the hole pattern of a mask with the same pattern which will be used to form the holes, so that the position of the expanded area precisely corresponds to the position through which the hole will penetrate.

Next, a description is given for a hole forming step, or aperture forming step, between lead lines of a lead layer formed by the resist pattern 30, in order to form connecting paths from an upper layer to a lower layer.

FIG. 1(B) is an illustration for explaining the formation of a hole layer. In FIG. 1(B), a mask 20 for forming holes includes hole patterns 21. Hole patterns 21a and 21b are unintentionally deviated from designed positions shown by broken lines. The mask 20 is identical to the second-time exposure mask 20 in FIG. 1(A) used to form a lead layer. A positive resist film for forming a hole is exposed by exposure mask 20 through the reduction projection exposure method.

As shown in FIG. 1(B), a positive resist pattern 40, which includes hole patterns 41 for forming holes, is formed by the hole pattern mask 20. Hole patterns 41a and 41b are deviated from their designed positions shown by the broken lines.

An actual manufacturing process for a semiconductor device is described below. First, a conductive film such as a polysilicon film or aluminum film for forming a lead layer is formed on an insulating film on a semiconductor substrate. Then, a resist film is applied onto the conductive film to form resist pattern 30 for forming conductive leads. Then, the conductive film is etched to form a lead layer by using resist pattern 30 as a mask. Thereafter, the next resist film is formed on the lead layer thus formed. Then, the resist pattern 40 for forming a through-hole between lead layers is formed on the resist film. Then, through-holes (penetration aperture portions) are formed through etching by using the hole resist pattern 40. Thereafter, the holes are filled with conductive material such as aluminum to form conductive paths which connect the upper and lower layers.

The above exposure method for forming a pattern uses an exposure light such as the g-line (436 nm) or i-line (365 nm) of a mercury lamp, a KrF excimer laser beam (248 nm), or an ArF excimer laser beam (193 nm) to expose a pattern by the reduction projection exposure method.

In the manufacturing process of a semiconductor device as described above, a comparative analysis of the resist pattern 30 for forming a lead layer shown in FIG. 1(A) and the resist pattern 40 for forming a hole pattern shown in FIG. 1(B) is given below. In the case of the mask 20 for forming holes, not all hole patterns 21 are correctly formed at their designed positions; some hole patterns such as hole patterns 21a and 21b are unintentionally deviated from their designed positions. Therefore, also in the hole-forming resist pattern 40 formed by the mask 20, some hole patterns such as hole patterns 41a and 41b are deviated from their designed positions. However, by performing a double exposure by the lead mask 10 and the hole mask 20 to form a lead pattern as performed in the first embodiment, the expanded portions between leads in the lead pattern 30 where each of the through holes penetrates are also formed at deviated positions due to the double exposure. Thereby, a hole can penetrate through a lead layer without contacting any lead. However, if every expanded portion 33 between leads of the lead pattern 30 is located at the designed position, a through hole may contact a lead when a hole pattern 21 includes deviated patterns such as the patterns 21a and 21b. However, by modifying the lead pattern using the exact same hole mask 20 which is to be used for the subsequent hole-forming step and thereby forming a lead pattern as in this embodiment, it is possible to form a lead pattern provided with expanded portions between leads so as to correspond accurately with each of the hole positions to be formed in the subsequent step.

By performing the exposures in the above manner, any overlap error between a lead layer and a hole layer is eliminated, if this overlap error was caused by an error in the position accuracy of a pattern on a mask. Thus, the overlap allowance necessary for a layout design can be decreased. That is, by using this exposure method, it is possible to arrange more patterns in the same area, and thereby, a higher integration density is realized.

This embodiment may be summarized or restated as follows. In this embodiment of a manufacturing method of a semiconductor device, first, a line resist pattern (a second resist pattern) 30 is formed by double exposure of a line pattern mask (a second mask) 10 and a hole pattern mask (a first mask) 20, and a line layer (a second layer) is formed through the line resist pattern (the second resist pattern) 30.

Then, a hole resist pattern (a first resist pattern) 40 is formed by an exposure of a hole pattern mask (a first mask) 20, and a hole lead layer (a first layer) is formed adjacent to the line layer (the second layer) through a hole resist pattern (a first resist pattern) 40.

Further, the hole pattern mask (the first mask) 20 is used for forming a pattern of a plurality of holes perpendicular to a principal plane of a semiconductor substrate, and the line pattern mask (the second mask) 30 is used for forming a pattern of a plurality of lines parallel to the principal plane of the semiconductor substrate.

Further, the hole lead layer (the first layer) is composed of a plurality of inter layer conductive path perpendicular to a principal plane of the semiconductor substrate, and the line layer (the second layer) is composed of a plurality of conductive lines parallel to the principal plane of the semiconductor substrate. Also, each conductive path is positioned between the lines.

Embodiment 2

Embodiment 2 of the present invention is described below by referring to the accompanying drawings. FIGS. 2(A) and 2(B) are conceptual drawings showing a method for exposing a lead layer of the embodiment 2. In the second embodiment, a lead-layer pattern is formed which improves the overlap accuracy over the holes formed in a lower layer.

First, a step of forming holes or apertures, which penetrate between layers for forming connection paths, is described below.

FIG. 2(A) is an illustration for explaining the formation of a hole layer. In FIG. 2(A), an exposure mask 110 for forming a hole layer includes a hole pattern 111. In hole-forming mask 110, holes 111a and 111b are formed at positions unintentionally deviated from their designed positions shown by the broken lines respectively. A positive resist film for forming holes is exposed by the exposure mask 110 through a reduction projection exposure method. The exposure mask may be composed of a chromium (Cr) mask or half tone mask.

As shown in FIG. 2(A), a positive resist pattern 120 is formed by the exposure mask 110 and includes a hole pattern 121 for forming holes. Hole patterns 121a and 121b are deviated from their designed positions shown by the broken lines respectively.

Next, a step of forming a lead layer to be connected through the hole patterns thus formed on the upper side of the hole layer is described below.

In FIG. 2(B), a first-time exposure mask 130 for forming a lead layer includes a lead pattern 131 of parallel lines and a pattern 132 of open areas. The exposure mask may comprise a chromium (Cr) mask or the like.

To form a lead layer pattern, a negative resist film previously formed is first exposed by the mask 130 having a parallel lead pattern. The exposure is performed at an exposure value at which the lead pattern is formed with the necessary dimensions and with each lead located above at least one hole.

Next, in FIG. 2(B), a second-time exposure mask 110 for forming a lead layer, which includes a hole pattern 111, is identical with the mask 110 used in the previous step to form holes on the lower lead layer. In the mask 110 of the hole pattern, holes 111a and 111b are unintentionally deviated from their designed positions shown by the broken lines respectively. Exposure mask 110 may comprise a chromium (Cr) mask or a half tone mask.

After the exposure by the first-time exposure mask 130 for forming a lead layer, another exposure is performed by using the second-time exposure mask 110 used in the previous hole forming step. This exposure is performed at an exposure value at which the lead pattern is formed with the necessary dimensions at a position so as to be connected through the holes, such that the expanded potions of the leads are located immediately above the holes. As described above, in the embodiment 2, a double exposure is applied to a negative resist film using the lead layer mask 130 and the hole layer mask 110.

As shown in FIG. 2(B), a negative resist pattern 140 is obtained by combining the first-time and second-time exposures. The negative resist pattern 140 includes a lead pattern 141, an inter-lead pattern 142, and expanded portions 143 of the leads for connection with the holes respectively. Expanded portions 143a and 143b of the leads are deviated correspondingly to the holes 121a and 121b formed at deviated positions in the hole resist pattern 120. Thus, each expanded position of the leads is determined by a hole mask 110 actually used, not only by the design, because of the double exposure by first-time exposure mask 130 and second-time exposure mask 110. As a result, each expanded position of the leads accurately corresponds to the position immediately above the holes.

An actual process for manufacturing a semiconductor-device is described below. An inter layer insulating film such as a silicon oxide film is formed on a conductive layer or a semiconductor substrate, and then, a resist film is formed on the inter layer insulating film. To form conductive paths penetrating the inter layer insulating film, a hole pattern 120 is formed on the resist film. Thereafter, holes or penetrating apertures are formed in the inter layer insulating film by using the resist pattern 120.

Then, a conductive film such as a polysilicon film or an aluminum film is disposed to form a lead layer on the insulating film and in the holes in the insulating film thus formed. Then, a resist film is applied onto the conductive film to form a negative resist pattern 140 for a lead pattern. Then, the conductive film is etched through the resist pattern 140 as a mask to form a lead layer, and inter layer connection is accomplished through the conductive path in the holes.

The reduction projection exposure method as described above for forming a pattern uses an exposure light such as the g-line (436 nm) or i-line (365 nm) of a mercury lamp, or a KrF excimer laser beam (248 nm), or an ArF excimer laser beam (193 nm).

Now, in the above manufacturing process of a semiconductor device, a comparative analysis is made between the resist pattern 120 for forming a hole pattern shown in FIG. 2(A) and the resist pattern 140 for forming a lead layer shown in FIG. 2(B). In the mask 120 for forming holes, not all hole patterns 121 are correctly formed at designed positions, but hole patterns 121a and 121b are unintentionally deviated from their designed positions. Expanded portions 141a and 141b of the lead pattern 140 at the hole position are also deviated correspondingly to the hole patterns 121a and 121b. Therefore, the holes are positioned without deviating from the expanded portions of the lead. If every expanded portion of the lead in a lead pattern is located at the designed position, a hole may be deviated from the lead when hole pattern 121 is deviated. However, in the embodiment 2, by using the hole mask 110 used in the previous step, a lead pattern is formed which has expanded portions in the lead pattern corresponding correctly to the hole positions formed in the previous step.

Thus, a lead layer is formed by using a negative resist and through double exposure by a lead-layer mask and by a hole mask. Thereby, improvement is attained in the overlap accuracy of the upper lead-layer to the lower hole layer formed by a positive resist.

In the case of this embodiment, because the lead layer is formed by a negative resist, hence the lead pattern is increased in width at portions exposed by a hole mask for a positive resist. Thereby, an overlap deviation due to a mutual position error between the masks is automatically corrected similarly to the case of the embodiment 1.

By performing the above exposure, an overlap error between a hole layer and a lead layer, due to a positional deviation of a pattern on a mask, is actually eliminated. Therefore, it is possible to decrease the overlap allowance necessary in the design by that amount. That is, by using the above exposure method, it is possible to arrange more patterns in the same area, and a higher integration density is realized.

This embodiment may be summarized or restated as follows. In this embodiment of a manufacturing method of a semiconductor device, first, a hole resist pattern (a first resist pattern) 120 is formed by an exposure of a hole pattern mask (a first mask) 110, and a hole lead layer (a first layer) is formed through a hole resist pattern (a first resist pattern) 120.

Then, a line resist pattern (a second resist pattern) 140 is formed by double exposure of a line pattern mask (a second mask) 130 and a hole pattern mask (a first mask) 110, and a line layer (a second layer) is formed adjacent to the hole lead layer (the first layer) through the line resist pattern (the second resist pattern) 140.

Further, the hole pattern mask (the first mask) 120 is used for forming a pattern of a plurality of holes perpendicular to a principal plane of a semiconductor substrate, and the line pattern mask (the second mask) 140 is used for forming a pattern of a plurality of lines parallel to the principal plane of the semiconductor substrate.

Further, the hole lead layer (the first layer) is composed of a plurality of inter layer conductive paths perpendicular to a principal plane of the semiconductor substrate, and the line layer (the second layer) is composed of a plurality of conductive lines parallel to the principal plane of the semiconductor substrate. Each line is positioned on at least one of the conductive paths.

Embodiment 3

Embodiment 3 of the present invention is described below by referring to the accompanying drawings. FIGS. 3(A) and 3(B) are conceptual drawings showing the lead-layer exposure method of the embodiment 3. In this embodiment, a lower hole layer is formed with a negative resist by a set of Levenson phase shift masks, and an upper lead layer is formed with a positive resist by a set of Levenson phase shift masks. Thereby, the overlap accuracy of the upper lead layer is improved with respect to the lower hole layer.

First, described below is a step for forming a hole or a penetrating aperture to form a conductive path for connecting upper and lower layers.

FIG. 3(A) is an illustration for explaining formation of a hole layer. In FIG. 3(A), a first-time exposure mask 210 is a Levenson phase-shifting mask for forming holes which includes chromium (Cr) aperture 211 without phase shift function, and a apertures 212 with phase shift function.

Further, in FIG. 3(A), a second-time exposure mask 220 is a Levenson phase-shifting mask for forming holes which includes chromium (Cr) apertures 221 without phase shift function, and apertures 222 with phase shift function. A negative resist film for forming a hole layer is double-exposed through the reduction projection exposure method by using the first-time exposure mask 210 and the second-time exposure mask 220.

As shown in FIG. 3(A), a negative resist pattern 230, which includes hole patterns 231 for forming holes, is formed by double exposure of the first-time and second-time Levenson phase shift masks 210 and 220.

Next, described below is a step for forming an upper lead layer to be connected to a lower hole layer formed by the resist pattern 230.

In FIG. 3(B), a first-time exposure mask 240 for forming a lead layer is a Levenson phase shift mask, which includes chromium (Cr) apertures 241 without phase shift function and apertures 242 with phase shift function.

A positive resist film previously prepared for forming a lead-layer pattern is under-exposed by the first time mask 240 having a parallel lead pattern.

Then, in FIG. 3(B), a second-time exposure mask 210 for forming a lead layer is a Levenson phase-shifting mask, which includes chromium (Cr) apertures 211 without phase shift function and apertures 212 with phase shift function. The mask 210 is identical with the first-time exposure mask 210 used to form holes in the lower hole layer. Further, a third-time exposure mask 220 for forming a lead layer is a Levenson phase-shifting mask, which includes chromium (Cr) apertures 221 without phase shift function and apertures 222 with phase shift function. The mask 220 is identical with the second-time exposure mask 220 used to form holes in the lower hole layer.

After the exposure by the first-time exposure mask 240 for forming a lead layer, the second-time and third-time exposures are performed by using the exposure masks same as the first-time and second-time masks 210 and 220 used in the previous hole step. These exposures are performed at an exposure value at which the lead pattern comes to have a necessary dimension in the areas above the hole locations. Thus, in embodiment 3, a triple exposure is applied to a positive resist film by the lead layer mask 240 and the hole layer masks 210 and 220 in order to form a lead resist layer.

As shown in FIG. 3(B), a positive resist pattern 270 is obtained by performing the triple exposure. The positive resist pattern 270 includes a lead pattern 271, an inter-lead pattern 272, and expanded portions 273 of the lead pattern for connection with holes.

Through the triple exposure by the first-time exposure mask 240 for forming a lead layer, and the second-time and third-time exposure masks 210 and 220 for forming a hole pattern, the expanded positions of the lead pattern are determined not by the design but by the exact same hole masks actually used for forming the hole layer, so that the expanded positions are accurately placed at the positions immediately above the holes.

Next, described below is an actual manufacturing process for a semiconductor device. An inter layer insulating film such as a silicon oxide film is formed on a conductive layer or a semiconductor substrate. Then, a resist film is formed on the insulating film, and a hole pattern 230 is formed on the resist film to form conductive paths penetrating the inter layer insulating film. Thereafter, holes or penetrating apertures are formed in the insulating film by resist pattern 230.

Then, a conductive film such as a polysilicon film or aluminum film for forming a lead layer is formed on the insulating film and in the holes in the insulating-film thus formed. Then, a resist film is applied onto the conductive film to form a resist pattern 270 for forming a lead layer. Then, the conductive film is etched by using the resist pattern 270 as a mask to form a lead layer and connecting path through the holes.

The above method of the reduction projection exposure for forming patterns uses an exposure light such as the g-line (436 nm) or i-line (365 nm) of a mercury lamp, or a KrF excimer laser beam (248 nm), or an ArF excimer laser beam (193 nm).

Now, in the above process for manufacturing a semiconductor device, an analytical comparison is made between the resist pattern 230 for forming a hole pattern shown in FIG. 3(A) and the resist pattern 270 for forming a lead layer shown in FIG. 3(B). In the embodiment 3, by forming a lead pattern with the hole masks 210 and 220 used for the previous hole step, a lead pattern is obtained which has expanded portions accurately corresponding to the positions of the holes formed in the previous step.

Thus, a lower hole layer is formed with a negative resist by the double exposure method using a set of Levenson phase-shifting masks. An upper lead layer is formed with a positive resist using a Levenson phase-shifting mask through under-exposure, and further by double exposure additionally performed with the same two hole masks used in the hole formation. That is, the lead layer is finally formed using triple exposure. Thus, the overlap accuracy of an upper lead layer formed using a positive resist is improved with respect to the lower hole layer formed using a negative resist.

By performing the exposure in the above manner, any error due to the positional deviation of a pattern on a mask is practically eliminated from the overall overlapping errors between the hole and the lead layer. Therefore, the overlap allowance necessary in the design can be decreased by that amount. That is, by using the above exposure method, it is possible to arrange more patterns in the same area, and a higher integration density is realized.

This embodiment may be summarized or restated as follows. In this embodiment of a manufacturing method for a semiconductor device, first, a hole resist pattern (a first resist pattern) 230 is formed by exposure through a set of hole pattern masks (a first masks) 210 and 220, and a hole lead layer (a first layer) is formed through a hole resist pattern (a first resist pattern) 230.

Then, a line resist pattern (a second resist pattern) 270 is formed by double exposure of a line pattern mask (a second mask) 240 and a set of hole pattern masks (a first masks) 210 and 220, and a line layer (a second layer) is formed adjacent to the hole lead layer (the first layer) through the line resist pattern (the second resist pattern) 270.

Further, the set of hole pattern masks (the first masks) 210 and 220 is used for forming a pattern of a plurality of holes perpendicular to the principal plane of a semiconductor substrate, and the line pattern mask (the second mask) 240 is used for forming a pattern of a plurality of lines parallel to the principal plane of the semiconductor substrate.

Further, the hole lead layer (the first layer) is composed of a plurality of inter layer conductive paths perpendicular to the principal plane of the semiconductor substrate, and the line layer (the second layer) is composed of a plurality of conductive lines parallel to the principal plane of the semiconductor substrate. Also, each line is positioned on at least one of the conductive paths.

As described above, the present invention provides an exposure method for automatically negating the influence of a mask error on overlap accuracy when a mask pattern is formed by a projection exposure method in a semiconductor device manufacturing process, and further provides a semiconductor device manufacturing method using the above exposure method.

Obviously many modifications and variations of the present invention are possible in light of the above teachings. It is therefore to be understood that, within the scope of the appended claims, the invention may by practiced otherwise than as specifically described.

What is claimed as new and is desired to be secured by Letters Patent of the United States is:

1. A method of manufacturing a semiconductor device on a semiconductor substrate comprising the steps of:

forming a first layer through a first resist pattern, said first resist pattern being formed by an exposure of a first mask, and forming a second layer adjacent to said first layer through a second resist pattern, said second resist pattern being formed by double exposure of a second mask and said first mask;

a plurality of inter layer conductive paths perpendicular to a principal plane of said semiconductor substrate are formed by said first mask, and then a plurality of conductive lines parallel to said principal plane of said semiconductor substrate are formed by said second mask and said first mask, and further each line is positioned on at least one of said conductive paths.

2. A method of manufacturing a semiconductor device on a semiconductor substrate comprising the steps of:

forming a first layer through a first resist pattern, said first resist pattern being formed by an exposure of a first mask, and forming a second layer adjacent to said first layer through a second resist pattern, said second resist pattern being formed by double exposure of a second mask and said first mask;

a plurality of conductive lines parallel to a principal plane of said semiconductor substrate are formed by said second mask and said first mask, and then a plurality of inter layer conductive paths perpendicular to said principal plane of said semiconductor substrate are formed by said second mask, and further each conductive path is positioned between said lines.

* * * * *